(12) United States Patent
Chen et al.

(10) Patent No.: US 10,165,639 B2
(45) Date of Patent: Dec. 25, 2018

(54) INTEGRATED LED DEVICE

(71) Applicant: MELEXIS TECHNOLOGIES NV, Tessenderlo (BE)

(72) Inventors: Jian Chen, Heist-op-den-Berg (BE); Thomas Freitag, Plaue (DE); Michael Bender, Erfurt (DE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/846,704

(22) Filed: Dec. 19, 2017

(65) Prior Publication Data

US 2018/0177011 A1 Jun. 21, 2018

(30) Foreign Application Priority Data

Dec. 20, 2016 (EP) .................................... 16205509

(51) Int. Cl.
| | | |
|---|---|---|
| *F21V 15/01* | (2006.01) | |
| *H05B 33/08* | (2006.01) | |
| *F21V 23/00* | (2015.01) | |
| *H01L 25/075* | (2006.01) | |
| *H01L 25/16* | (2006.01) | |

(52) U.S. Cl.
CPC ......... *H05B 33/0842* (2013.01); *F21V 15/01* (2013.01); *F21V 23/003* (2013.01); *H01L 25/0753* (2013.01); *H01L 25/167* (2013.01); *H01L 2224/05554* (2013.01); *H01L 2224/48091* (2013.01); *H01L 2224/48137* (2013.01); *H01L 2224/48247* (2013.01);
(Continued)

(58) Field of Classification Search
CPC .............. H01L 25/0753; H01L 25/167; H01L 31/0203; H01L 31/0869; H01L 31/18; H01L 33/46; H01L 33/56
USPC ...................................................... 257/79, 99
See application file for complete search history.

(56) References Cited

U.S. PATENT DOCUMENTS

| | | | |
|---|---|---|---|
| 8,933,473 B1 * | 1/2015 | Dubin | H01L 25/167 |
| | | | 257/79 |
| 9,553,125 B2 * | 1/2017 | Ogata | H01L 27/14683 |

(Continued)

FOREIGN PATENT DOCUMENTS

| | | |
|---|---|---|
| JP | H06230731 A | 8/1994 |
| JP | H0832106 A | 2/1996 |

(Continued)

OTHER PUBLICATIONS

Extended European Search Report from EP Application No. EP 16205509, dated Jun. 9, 2017.

*Primary Examiner* — Tung X Le
(74) *Attorney, Agent, or Firm* — Workman Nydegger

(57) ABSTRACT

The present invention relates to an integrated-LED device having a housing, whereby the housing comprises a multi-LED device comprising a transparent substrate and a plurality of light emitting diodes, LEDs, arranged for emitting light and disposed on said transparent substrate, an integrated circuit in connection with said LEDs and arranged for controlling said LEDs, a base comprising one or more base extensions, on which at least said multi-LED device is mounted, with said one or more base extensions so arranged or so shaped that a first opening is created to let pass LED light emitted through said transparent substrate by said plurality of LEDs.

15 Claims, 5 Drawing Sheets

(52) U.S. Cl.
 CPC ............ *H01L 2224/49171* (2013.01); *H01L 2224/73265* (2013.01); *H01L 2924/181* (2013.01)

(56) References Cited

U.S. PATENT DOCUMENTS

| | | | | |
|---|---|---|---|---|
| 2004/0173810 A1* | 9/2004 | Lin | ................... | H01L 33/486 257/100 |
| 2006/0027479 A1 | 2/2006 | Auburger et al. | | |
| 2008/0237611 A1* | 10/2008 | Cok | ................... | B82Y 20/00 257/79 |
| 2010/0001297 A1* | 1/2010 | Takashinna | ............ | H01L 33/60 257/88 |
| 2014/0183591 A1* | 7/2014 | Jow | ................... | H01L 27/14618 257/99 |
| 2014/0209931 A1 | 7/2014 | Liao | | |

FOREIGN PATENT DOCUMENTS

| | | |
|---|---|---|
| JP | H08148723 A | 6/1996 |
| JP | 2001096795 A | 4/2001 |
| WO | 2008002088 A1 | 1/2008 |

* cited by examiner

INTEGRATED LED DEVICE

FIELD OF THE INVENTION

The present invention is generally related to the field of light emitting devices. More in particular it relates to the packaging of light emitting devices for use in automotive applications.

BACKGROUND OF THE INVENTION

Ambient lighting in automotive applications is nowadays achieved by providing one or more-colour-light emitting diodes (LEDs) located in various positions in the car. Each of the LEDs is individually controlled in intensity and colour by an integrated circuit (IC) via a communication interface. The LEDs must be calibrated by means of the IC before use to a given target value. A diagnosis of the connected one or more colour LED must be performed during operation.

In today's applications the ambient lighting functionality is assembled on a single Printed Circuit Board (PCB), which requires a certain amount of space. For some applications it requires too big a space, especially if LEDs (and their controlling units) are very close to one another. Hence, there is a constant need to reduce the space occupied by the one or more colour-light emitting diodes significantly by further integration.

It is expected that the number of light emitting diodes used in cars will drastically increase in the coming years. Prognoses of more than 200 interior light sources have already been given for the near future. Given this evolution it is evident that there is a main concern to keep the cost of such a light source as low as possible. The cost issue is valid for the smart LED device, the controlling IC as well as for the used package.

It is known that LEDs as a light source produce a significant heat. In classic approaches a heat sink and a good thermal contact are applied to these applications. It is obvious, that a certain space for the heat sink is needed. This might be challenging in case of space limitations. Material like copper or aluminium for the heat sink is needed. Another way to solve the heat problem is the use of LEDs in a bigger matrix. The LEDs are usually put in a big matrix configuration over a given area, so that heat is not generated on a single point for the full power, but distributed over the area. This leads to a lower junction temperature of the LEDs and a longer life time. The use of so called micro-LEDs, i.e. very small LEDs, has been suggested for that purpose. Space saving has also been a motivation to apply semiconductor technology for interconnecting the LEDs, as bonding the micro-LEDs would take too much space.

Micro-LED technology comes from display applications, which, however, are covering a different functional scope. Therefore the packaging used in such display and screen applications is completely different from what is needed in automotive applications.

In today's automotive ambient light applications mostly three or four LEDs (Red, Green, Blue and White Colour) are packed together in one specialised package that contains a heat sink and/or a very good thermal contact to an external heat sink. The package is constructed with materials, which resist the relatively high temperature produced/caused by the LEDs.

FIG. 1 illustrates a LED device (16) as known in the art. On a glass or any other transparent substrate (5) Light Emitting Diodes (e.g. microLEDs) (1) of only one or more colours, e.g. red (1.1), blue (1.2) and green (1.3), are mounted e.g. by means of a microtransfer technology. On the same substrate one or more metallization layers (e.g. Aluminium or Copper) and insulation layers (e.g. Silicon Oxide, Silicon Nitride or Polyimid) are put as well, e.g. with a semiconductor technology (e.g. layer deposition, layer structuring). These one or more metallization layers connect the LEDs towards connection pads (4). In FIG. 1 only one interconnection layer with 4 wiring traces (2.1, 2.2, 2.3, 2.4) is shown. In case of a stacked assembly an additional protection layer (6) might cover the LEDs and the wirering. The LED device as described is well known e.g. for use in display applications.

The use of a multitude of microLEDs instead of classic LEDs is advantageous in that it reduces the junction temperature significantly from ca. 900° C. to 150° C., because the heat is distributed over a given surface. An LED device according to FIG. 1 thus generates less self-heating compared to conventional LED devices because it is composed of many small LED cells spreading over a large area on a substrate, where the heat can spread out easily.

WO2008/002088 discloses a lead frame having heat sink supporting parts, as well as a light emitting diode package in which the lead frame is employed. The lead frame includes an outer frame surrounding a predetermined region. The heat sink supporting parts extend inward to face each other from the outer frame. Each of the supporting parts has an end portion coupled to a heat sink. Further, lead terminals extend inward to face each other from the outer frame. The lead terminals are spaced apart from the supporting parts. Accordingly, a package main body can be formed by an insert molding technique after the heat sink is coupled to the end portions of the supporting parts, and the heat sink and the lead terminals can be easily aligned.

There is a need for finding a suitable package for such a LED device comprising a large number of light emitting sources and steered by means of an integrated circuit controller, given rather stringent space limitations.

SUMMARY OF THE INVENTION

It is an object of embodiments of the present invention to provide for a package for a LED device comprising a large number of light emitting sources which is controlled by an integrated circuit controller, whereby the package at least meets the space constraints.

The above objective is accomplished by the solution according to the present invention.

In a first aspect the invention relates to an integrated-LED device having a housing, whereby the housing comprises
  a multi-LED device comprising a transparent substrate and a plurality of light emitting diodes, LEDs, arranged for emitting light and disposed on the transparent substrate,
  an integrated circuit in connection with the LEDs and arranged for controlling the LEDs,
  a base comprising one or more base extensions, on which at least the multi-LED device is mounted, with said one or more base extensions so arranged or so shaped that a first opening is created to let pass LED light emitted through the transparent substrate by the plurality of LEDs.

The proposed solution indeed allows for a low cost, compact package which is also compliant with the JEDEC standard.

In a preferred embodiment the housing has a second opening in the housing corresponding to the first opening to let LED light pass out of the housing.

In a preferred embodiment the integrated circuit is mounted side by side to the multi-LED device.

In a preferred embodiment the integrated circuit is stacked on the multi-LED device. A protection layer is then advantageously provided between the multi-LED device and the integrated circuit.

In another embodiment the one or more base extensions are part of the base, said base being in one piece.

In a preferred embodiment the one or more base extensions are so formed that, when mounted on a printed circuit board, an optical window of the integrated LED device faces away from the printed circuit board.

In one embodiment the integrated LED device as described, is implemented as a quad flat no-leads (QFN) package.

In another embodiment the integrated LED device is mounted on a printed circuit board provided with a predefined hole to let LED light pass.

In yet another embodiment the integrated LED device comprises an optical transparent protection layer to fill said first opening.

In preferred embodiments the base is a metal lead frame or a FR4 or a ceramic based base.

In another aspect the invention relates to a method for manufacturing an integrated LED device as previously described. The method comprises a step of arranging or shaping the one or more base extensions so that a first opening is created to let pass LED light emitted through the transparent substrate by the plurality of LEDs.

In certain embodiments the method comprises providing in the housing a second opening corresponding to the first opening to let LED light pass out of the housing.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
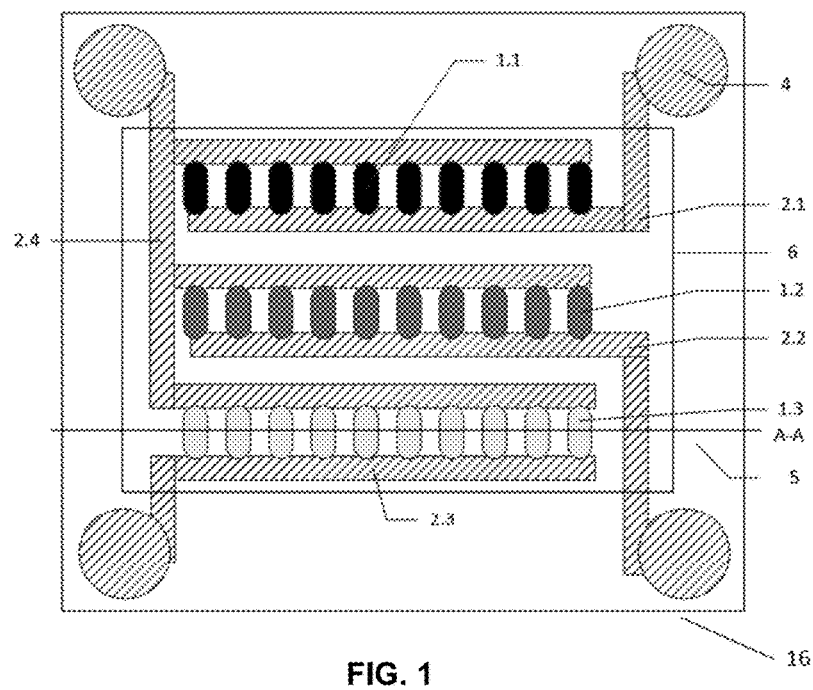
FIG. 1 illustrates a LED device as known in the art.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention aims to present an integrated LED device containing a multi-LED device as shown in FIG. 1.

Figure 2:
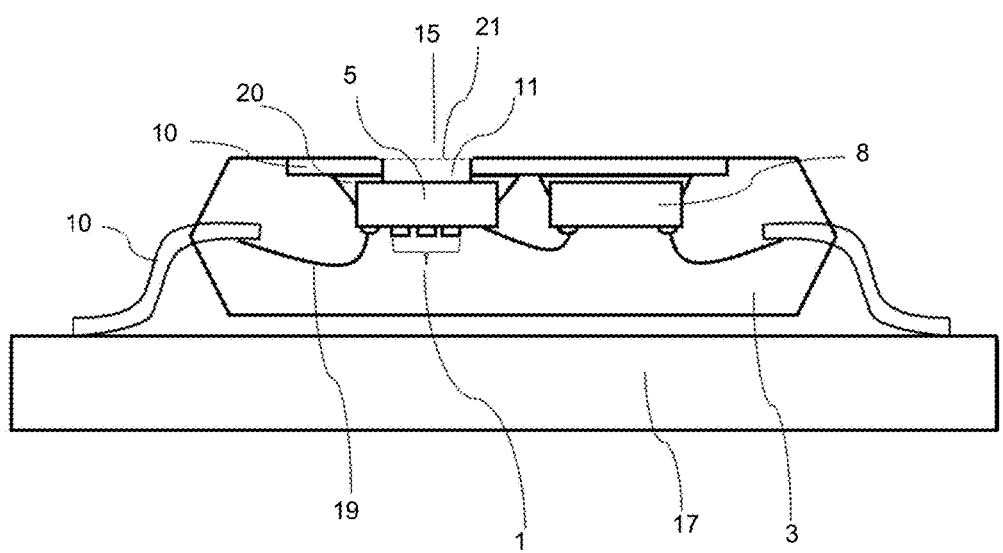
FIG. 2 illustrates an embodiment of an integrated LED device according to the present invention.

FIG. 2 illustrates an embodiment of an assembly of the LED device of FIG. 1 in a standard JEDEC package, for example Silicon-on-Integrated Circuit (SOIC), Shrink Small Outline Package (SSOP), quad flat package (QFP), quad flat no-leads (QFN). The controlling driver IC (8) is mounted side by side with the LED device. The LED device and the control IC are mounted on a base, in this case a metal lead frame. The base extensions (10), i.e. the leads, are in the embodiment of FIG. 2 part of a lead frame. For the mounting of the LED device and the controlling IC standard assembling steps can be used like die attach and wire bonding and molding. The die attach material (20) connecting the LED and the base can be epoxy or silicone material or solder. It is applied in a closed circle around the hole of the base, thereby making sure there is no residue left in the optical path. Alternatively, one can use a transparent die attach film applied on wafer level as long as the film doesn't degrade much the optical performance of the LED. Bonding wires (19), e.g. Au, Al or Cu, are used to make interconnections between the IC and the LED and the I/O pins. The housing (3) can be thermoset or thermoplastic based encapsulation material. In FIG. 2 the leads of the lead frame are formed in a reverse way, so that in the end application after the housing is soldered on a printed circuit board (PCB) the optical window (15) will be facing up, i.e. away from the PCB (17).

Bonding is done between the LED device and the controlling IC as well as from the LED device to the lead frame pins as well as from the controlling device to the lead frame pins. It can be observed that the smart LED device is mounted upside down to the lead frame, so that the light can pass through the transparent substrate of the LED device and the openings in the lead frame and in the package to the outside. It can be observed that the transparent substrate is automatically forming the optical window (15), so that no further process step is needed. The use of JEDEC package and standard assembly technologies allows a compact and cost optimal device assembly.

In one embodiment the LEDs are micro-LEDs, which means that the LEDs have very small outline dimensions. Micro-LEDs can have a size in the range of 5 to 500 µm, preferably in the range of 10 to 100 µm.

Figure 3:
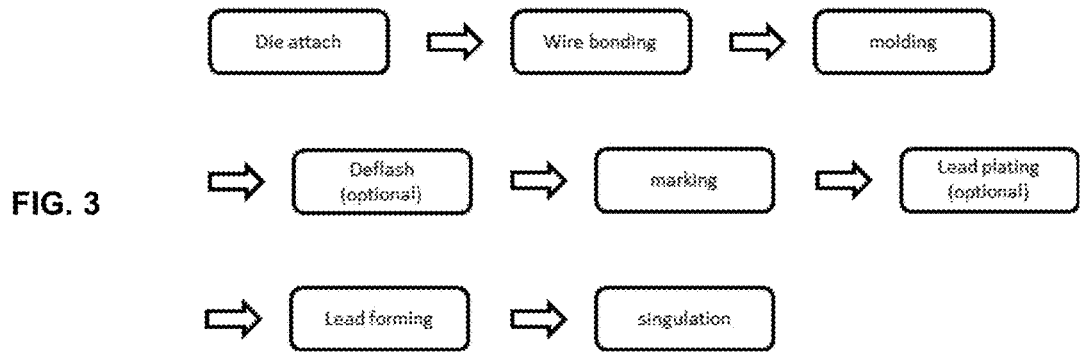
FIG. 3 illustrates steps in the assembly process.

The process flow for obtaining the packaging solution of FIG. 2 is shown in FIG. 3. First the LED device and the driver IC are placed on a lead frame by an adhesive. The interconnection of the ICs is done by wire bonding using e.g. Au or Cu wires. Then the devices are encapsulated by means of overmolding. To keep the optical window clean, one can either use film assisted molding or add a deflash process after the molding. Marking is to keep a good traceability.

Lead frame plating is optional if the lead frame is pre-preplated. After lead forming and singulation, the device is ready to be used.

Figure 4:
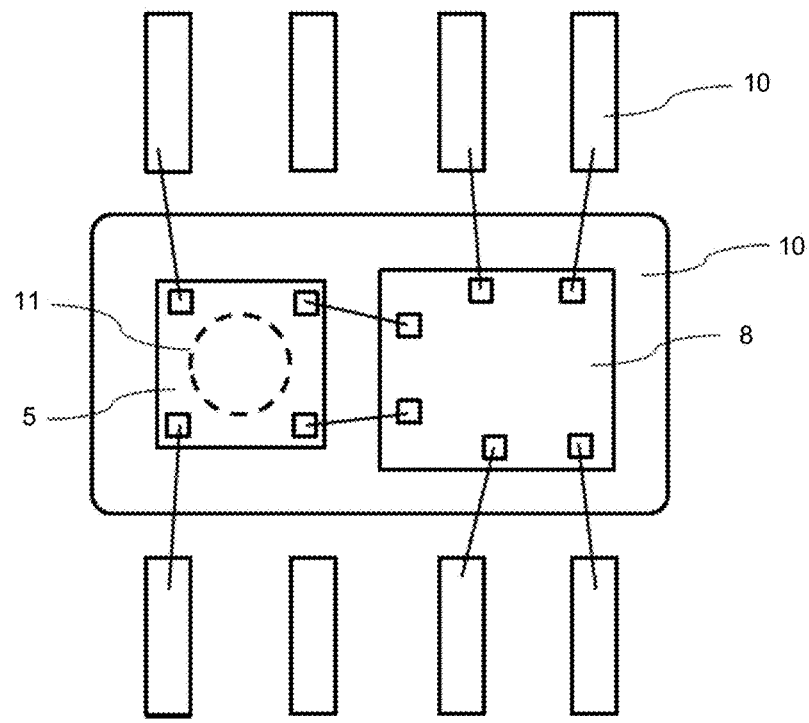
FIG. 4 illustrates the mounting and bonding of the multi-LED device and the integrated circuit.

In FIG. 4 a lead frame layout (including the die pad) corresponding to FIG. 2 is shown. Note the opening (11) in the lead frame. The figure further shows the mounting and the bonding of the LED device and the controlling IC to the lead frame. The number of pins on both devices is just an example. There can be less or more pins depending on the functionality of the complete light source in e.g. an automotive ambient application. The light is emitted through the opening in the lead frame.

Figure 5:
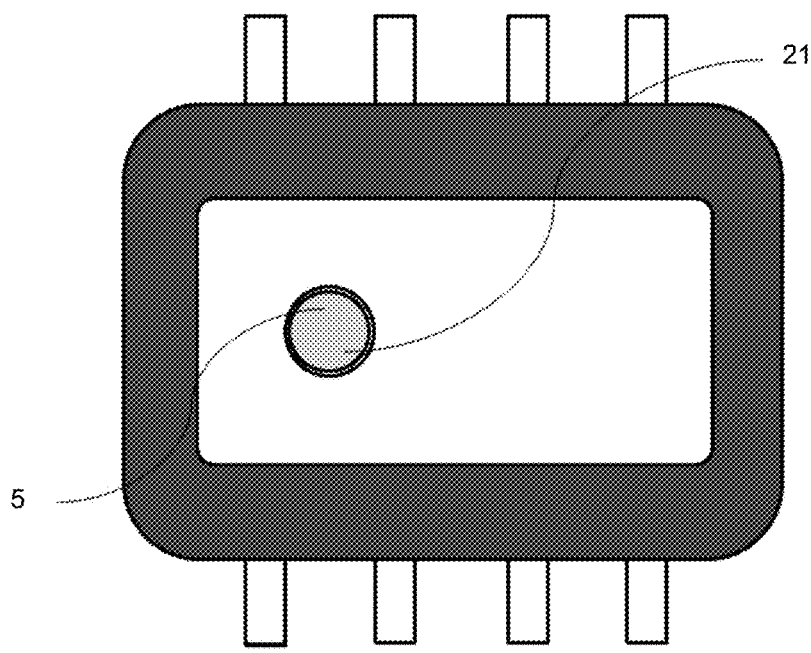
FIG. 5 illustrates a top view of the finished integrated LED device.

FIG. 5 shows an embodiment wherein the lead frame is exposed to the molding compound and forms therefore also a surface of the package unit. The figure also illustrates the opening of the lead frame and the transparent substrate of the LED device. An optional additional optical transparent protection layer (21) (i.e. an optical coating to fill up the cavity at the backside of the glass substrate, i.e. the side where the light is emitted) may avoid collection of dust or residues in the lead frame during application use in the opening.

Figure 6:
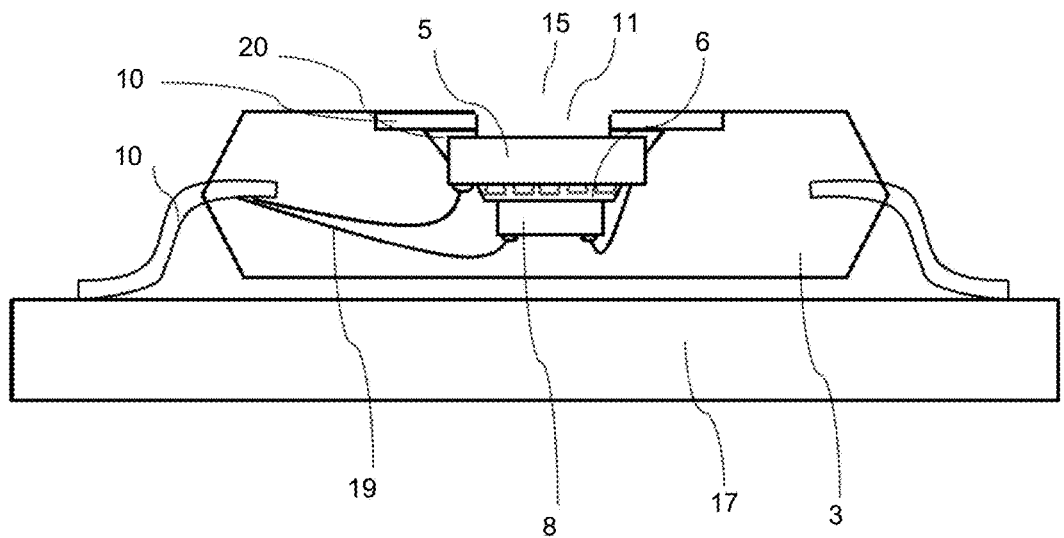
FIG. 6 illustrates an embodiment of the integrated LED device wherein the multi-LED device and the controlling IC are stacked.

FIG. 6 represents an embodiment of the packaging unit wherein the LED device and the controlling IC are mounted in a stacked realization. The LED device needs here an additional protection layer (6), so that the controlling IC can be mounted to the smart LED device using a conventional die attach technology.

Figure 7:
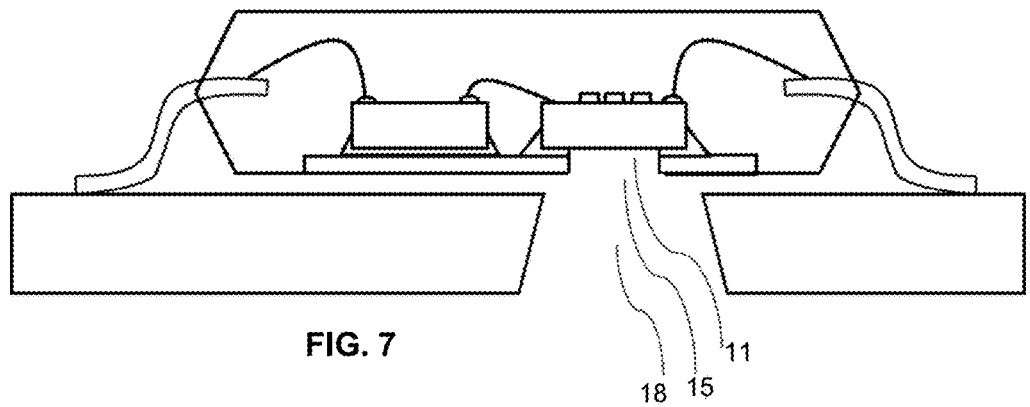
FIG. 7 illustrates an embodiment wherein the integrated LED device is mounted on a printed circuit board having itself also an opening to let LED light pass.

FIG. 7 shows an embodiment wherein the leads of the lead frame are formed in the standard opposite direction compared to the previously discussed embodiments. In this realization the light is emitted through the bottom side of the package unit. Therefore the PCB also has an opening (18) to release the light.

Figure 8:
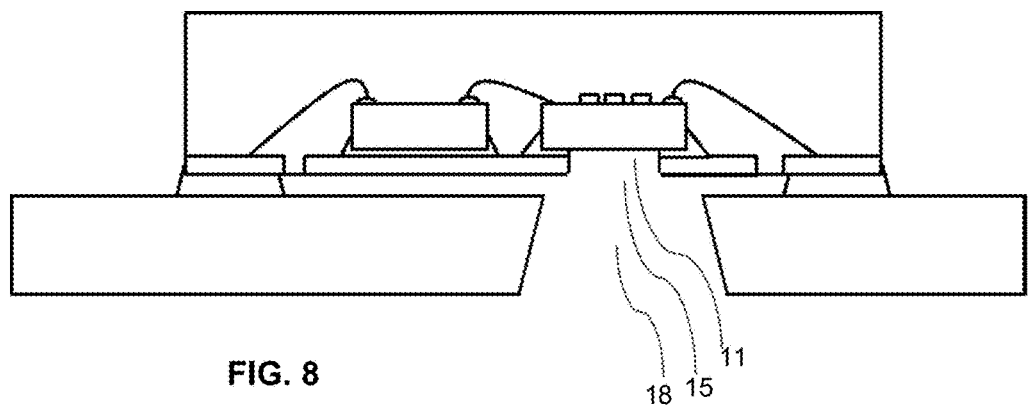
FIG. 8 illustrates an embodiment of the integrated LED device implemented as a QFN package.

FIG. 8 shows a leadless embodiment with a so called QFN package, which is also a cost optimal JEDEC standard package. This shows that the packaging unit of the present invention does not only cover implementations suitable for SOIC packages. The main advantage of a QFN package is that there is usually a tape attached to the bottom of the lead frame blocking the mold compound entering the backside of the lead frame during molding process, therefore no mold compound inside the hole on the lead frame either. So, there is no need for film-assisted molding or an extra deflash process here.

Figure 9:
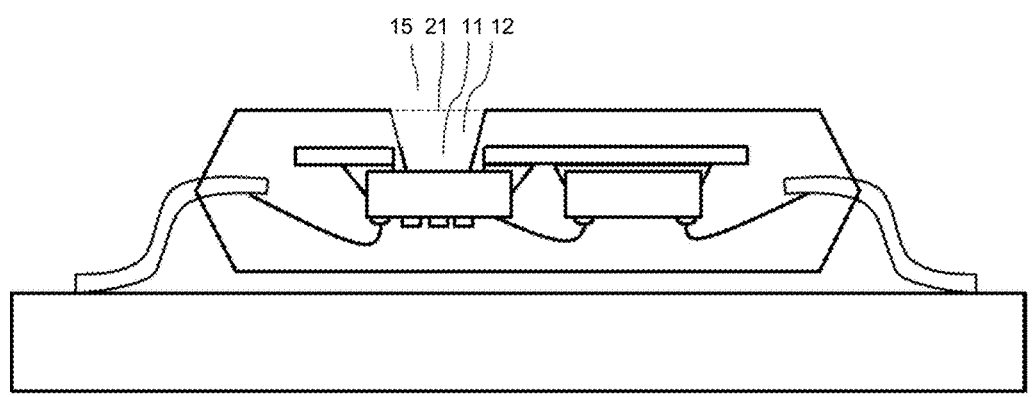
FIG. 9 illustrates an embodiment with non-exposed base extensions.

In all previous embodiments an 'exposed pad' realization has been shown. This means that the lead frame is always exposed on one package side (bottom or top of a package). In the embodiment of FIG. 9 a non-exposed lead frame is used. This means the die pad on which the LED device and the controlling device are mounted, is inside the molding. The multi LED device emits the light through the first opening (11) in the lead frame and through a second opening (12) in the housing. An optional additional optical transparent protection layer 21 (i.e. an optical coating to fill up the cavity at the backside of the glass substrate) may avoid collection of dust or residues in the lead frame and in the housing during application use. The optical window (15) of the integrated LED device faces away from the printed circuit board.

Figure 10:
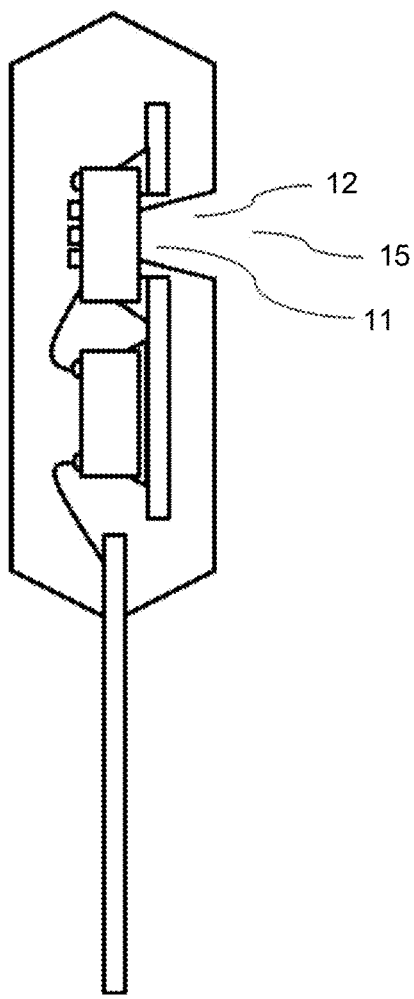
FIG. 10 illustrates an embodiment without printed circuit board.

In the embodiment of FIG. 10 the leads are put just to one side of the package. If the number of leads is very small (e.g. 3 or 4 leads as for instance "supply connection", "ground connection", "single or double wire bus interface (e.g. LIN bus)", a PCB-less embodiment can be realized. Additional test pins can be provided on the other side of the package and also passive components can be placed inside the housing since there is no PCB needed any more.

One can make more combinations of the embodiments described above.

One can also consider a white encapsulation material.

All the components are molded together in one step with high pressure which is low cost but same time high reliability. There are no air pockets or enclosed cavity inside the housing which could be vulnerable for corrosion, leakage, dirt, etc.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An integrated-LED device having a housing, said housing comprising:
   a multi-LED device comprising a transparent substrate and a plurality of light emitting diodes (LEDs) arranged for emitting light and disposed on said transparent substrate,
   an integrated circuit in connection with said LEDs and arranged for controlling said LEDs,
   a base comprising one or more base extensions, on which at least said multi-LED device is mounted, with said one or more base extensions so arranged or so shaped that a first opening is created to let pass LED light emitted through said transparent substrate by said plurality of LEDs.

2. The integrated-LED device as in claim 1, wherein said integrated circuit is mounted side by side to said multi-LED device.

3. The integrated-LED device as in claim 1, wherein said integrated circuit is stacked on said multi-LED device.

4. The integrated-LED device as in claim 3, wherein a protection layer is provided between said multi-LED device and said integrated circuit.

5. The integrated-LED device as in claim 1, wherein said one or more base extensions are part of said base, said base being in one piece.

6. The integrated-LED device as in claim 1, wherein said one or more base extensions are so formed that, when mounted on a printed circuit board, an optical window of the integrated LED device faces away from the printed circuit board.

7. The integrated-LED device as in claim 1, implemented as a quad flat no-leads, QFN, package.

8. The integrated-LED device as in claim 7, mounted on a printed circuit board provided with a pre-defined hole to let LED light pass.

9. The integrated-LED device as in claim 1, wherein said one or more base extensions are exposed on one side of said housing.

10. The integrated-LED device as in claim 1, wherein said housing is made of a thermoset or thermoplastic material.

11. The integrated-LED device as in claim 10, wherein said base extensions are embedded in said mold compound.

12. The integrated-LED device as in claim 1, comprising an optical transparent protection layer to fill said first opening.

13. The integrated-LED device as in claim 1, wherein said base is a metal lead frame or FR4 or a ceramic based base.

14. The integrated-LED device as in claim 1, wherein said housing has a second opening in said housing corresponding to said first opening to let LED light pass out of said housing.

15. A method for manufacturing an integrated-LED device having a housing, the housing including
   a multi-LED device that includes a transparent substrate and a plurality of light emitting diodes (LEDs) arranged for emitting light and disposed on said transparent substrate, and
   an integrated circuit in connection with said LEDs and arranged for controlling said LEDs, the method comprising:
providing a base that includes one or more base extensions,
mounting said multi-LED device to said base, and
arranging or shaping said one or more base extensions so that a first opening is created to let pass LED light emitted through said transparent substrate by said plurality of LEDs.

* * * * *